United States Patent [19]

Hasegawa

[11] Patent Number: 4,652,774

[45] Date of Patent: Mar. 24, 1987

[54] RECTANGULAR WAVE-SHAPING CIRCUIT WITH VARYING THRESHOLD LEVEL

[75] Inventor: Kazuo Hasegawa, Furukawa, Japan

[73] Assignee: Alps Electric Co., Ltd., Japan

[21] Appl. No.: 752,907

[22] Filed: Jul. 8, 1985

[30] Foreign Application Priority Data

Jul. 6, 1984 [JP] Japan ............................. 59-102085[U]

[51] Int. Cl.$^4$ ...................... H03K 5/01; H03K 12/00; H03K 5/153
[52] U.S. Cl. ................................... 307/268; 307/359; 307/360; 328/146
[58] Field of Search ............... 328/115, 146; 307/260, 307/268, 265, 359, 356, 363, 261, 547

[56] References Cited

U.S. PATENT DOCUMENTS 3,700,920  10/1972  Eyler .................................. 328/115

*Primary Examiner*—Stanley D. Miller
*Assistant Examiner*—Timothy P. Callahan
*Attorney, Agent, or Firm*—Guy W. Shoup

[57] ABSTRACT

A wave-shaping circuit for receiving an electrical signal from a photosensitive device, for example, and delivering a rectangular output does not use an expensive DC amplifier but comprises a comparator, a pair of diodes connected between first and second input terminals of the comparator in an antiparallel relation, and a capacitor placed between the first input terminal of the comparator and the signal input terminal of the circuit for filtering out DC component. A combination of a zener diode and a capacitor is connected to the second terminal of the comparator to establish a threshold level, with which the signal level applied to the first input terminal of the comparator is compared.

2 Claims, 7 Drawing Figures

RECTANGULAR WAVE-SHAPING CIRCUIT WITH VARYING THRESHOLD LEVEL

FIELD OF THE INVENTION

The present invention relates to a wave-shaping circuit and, more particularly, to a wave-shaping circuit which receives an electrical signal produced by a photosensitive device in a light-receiving circuit, for example, and delivers a rectangular output without using an expensive DC amplifier.

BACKGROUND OF THE INVENTION

Light-receiving circuits for receiving light signals have heretofore used configurations as shown in FIGS. 4 and 5, in each of which the configuration comprises a photosensitive device 1, a DC amplifier 2, a comparator 3, a peak detector 4, an average value output portion 5 that is formed by an integrator circuit, resistors R1–R4, and a capacitor C1. The comparator 3 has a first input terminal 6, a second input terminal 7, and an output terminal 8.

In the configuration shown in FIG. 4, a signal that is converted into an electrical signal by the photosensitive device 1 is amplified by the DC amplifier 2 without losing its DC component. Then, the signal is supplied to the first input terminal 6 of the comparator 3. The output from the amplifier 2 is also applied to the peak detector 4, which delivers an output whose magnitude, or threshold value TH indicated by the broken line in FIG. 6(A), is half, for example, of the peak value SG indicated by the solid line in FIG. 6(A). This output is fed to the second input terminal 7 of the comparator 3. Thus, a rectangular waveform appears at the output terminal 8 of the comparator 3, and this waveform assumes a high level during the periods in which the signal SG is in excess of the threshold value TH, as shown in FIG. 6(B).

In the configuration shown in FIG. 5, the output from the DC amplifier 2 is applied to the first input terminal 6 of the comparator 3 in the same way as in the configuration shown in FIG. 4. Under this condition, however, the average value output portion 5 delivers an output, which is derived by integrating the signal SG indicated by the solid line and constitutes the threshold value TH indicated by the broken line in FIG. 7(A), because of the integrating function of the capacitor C1. As a result, a rectangular waveform appears at the output terminal 8 of the comparator 3, and this waveform is at a high level during the periods in which the signal SG is larger than the threshold value TH, as shown in FIG. 7(B).

Heretofore, shaped electrical signals have been obtained in the manner as described above. Also as mentioned previously, it is desired that the output signal from the photosensitive device 1 be amplified without losing its DC component, thus necessitating the use of the expensive DC amplifier 2.

SUMMARY OF THE INVENTION

It is a general object of the present invention to provide a wave-shaping circuit which is free of the foregoing problem.

It is a more specific object of the invention to provide a wave-shaping circuit including a comparator having first and second input terminals, the circuit being so designed that a threshold level is applied to the second input terminal and that the signal level applied to the first terminal is made larger or smaller than the threshold level by a given value, whereby the circuit is capable of delivering a correct rectangular output even if pulsive signals no longer having DC component are applied to it.

These objects are achieved by a wave-shaping circuit comprising a comparator for comparing the voltage level of an input signal with a threshold level and delivering a voltage corresponding to the result of the comparison, a pair of level-shifting diodes connected between first and second input terminals of the comparator in an antiparallel relation, the second terminal receiving a threshold value, a capacitor placed between the first input terminal of the comparator and a signal input terminal and acting to cut off DC component, a pull-up resistor connected between the output terminal of the comparator and a power terminal, a feedback resistor connected between the output terminal and the aforementioned first input terminal, and wherein the signal applied to the first input terminal is made larger or smaller, depending on the voltage appearing at the output terminal of the comparator, than the threshold value by a given level. The invention is hereinafter described in detail with reference to the accompanying drawings.

DETAILED DESCRIPTION OF THE INVENTION

Figure 1:
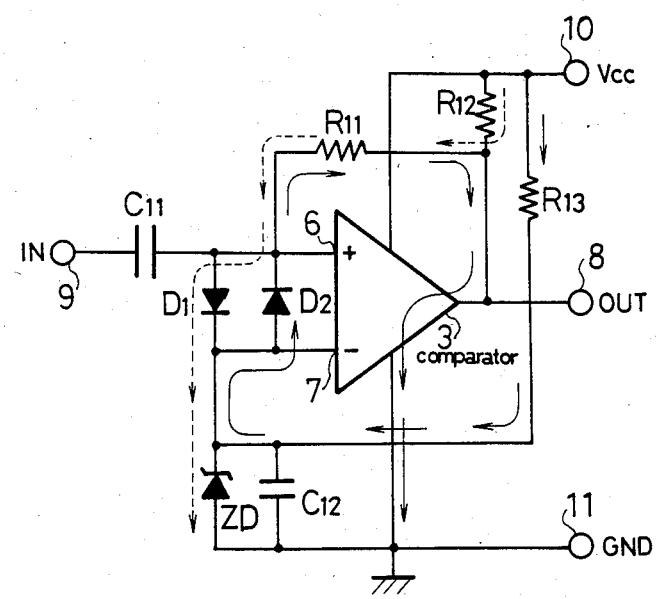
FIG. 1 is a circuit diagram of a configuration according to the present invention.

A circuit embodying the concept of the present invention is shown in FIG. 1. Input and output signals to and from the circuit shown in FIG. 1 are shown in FIG. 2. Signals supplied to the comparator of the circuit shown in FIG. 1 are shown in FIGS. 3(A) and (B).

Figure 4:
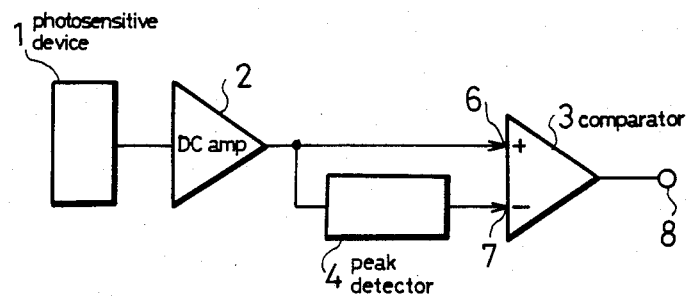
FIGS. 4 and 5 are circuit diagrams of conventional configurations.
Figure 5:
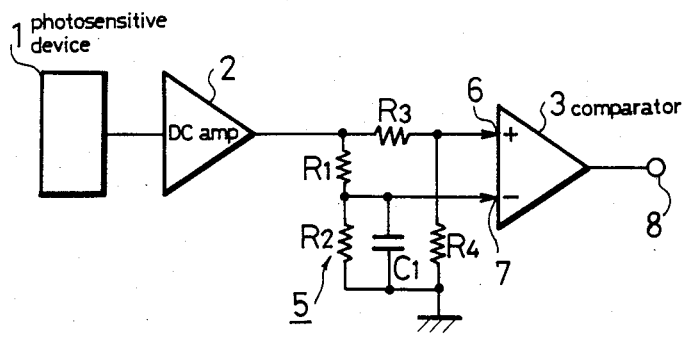
Figure 6A:
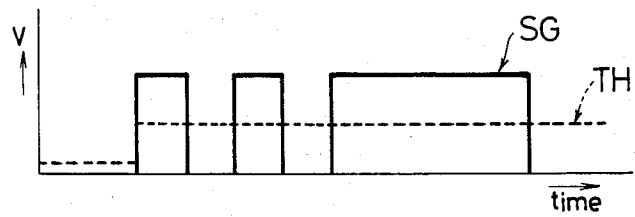
FIGS. 6 and 7 are waveform diagrams for illustrating the operation of the configurations shown in FIGS. 4 and 5, respectively.
Figure 6B:
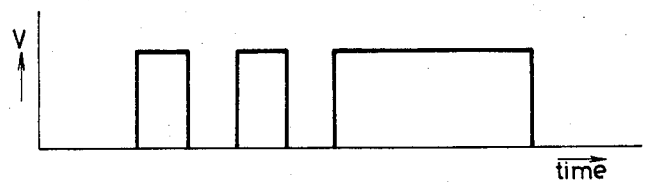
Figure 7A:
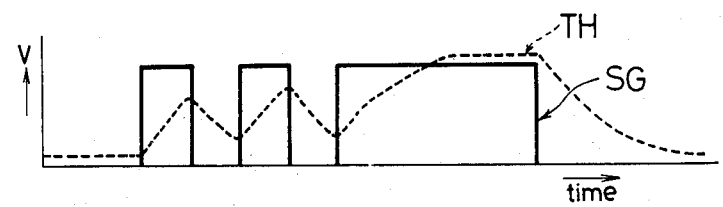
Figure 7B:
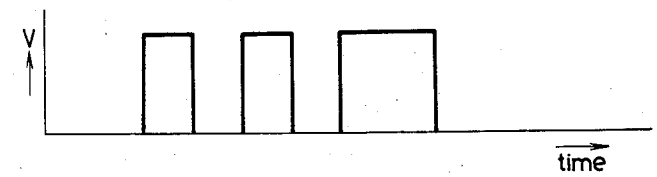

The components indicated by reference numerals 3, 6, 7, and 8 in FIG. 1 correspond to those indicated by the same numerals in FIGS. 4 and 5. The circuit of FIG. 1 further includes a signal input terminal 9 which corresponds to the output terminal of the photosensitive device 1 shown in FIGS. 4 or 5. Also shown are a power terminal 10, a grounded terminal 11, a capacitor C11 for cutting off DC component, diodes D1 and D2 for shifting signal level, a zener diode ZD, a feedback resistor R11, a pull-up resistor R12, a resistor R13 for supplying a bias, and a bypass capacitor C12.

Figure 2A:
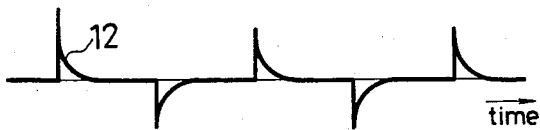
FIG. 2 is a waveform diagram showing the input and output signals to and from the configuration shown in FIG. 1.
Figure 2B:
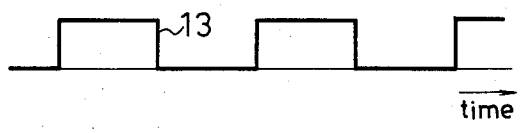
Figure 3A:
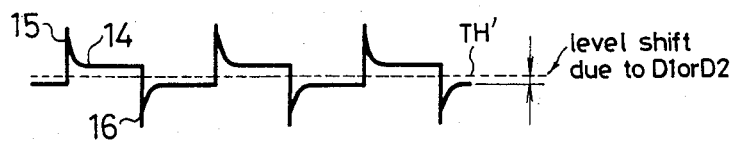
FIG. 3 is a waveform diagram showing signals applied to the comparator shown in FIG. 1.

In the configuration shown in FIG. 1, an electrical signal 12 the DC component of which has been filtered out by the capacitor C11 and which is indicated in FIG. 2(A) is supplied to the first input terminal 6 of the comparator 3. At this time, a signal 13 shaped as shown in FIG. 2(B) appears at the output terminal 8 of the comparator 3.

The circuit of FIG. 1 assumes two stable conditions when the signal at the output terminal of the comparator 3 is at high level and at low level. Specifically, when the signal level is high, the electrical signal flows as indicated by the dotted arrows, causing a signal of a given threshold value TH' created by the zener diode ZD to be applied to the second input terminal 7 of the comparator 3. The DC voltage level at the first input terminal 6 of the comparator 3 is made higher than the threshold value TH' by ΔV, which may be considered to correspond to the voltage drop across the diode D1. The signal from the capacitor C11 is superimposed on this DC level applied to the first input terminal 6 of the comparator 3.

Inversely, when the signal appearing at the output terminal of the comparator 3 is at low level, the current flows as indicated by the solid arrows. In this case, the DC voltage level applied to the first input terminal 6 of the comparator 3 is lower than the threshold value TH' at the second input terminal 7 by voltage ΔV corresponding to the voltage drop across the diode D2. The signal from the capacitor C11 is superimposed on this DC voltage level applied to the first input terminal 6 of the comparator 3.

Thus, when a pulsive signal as shown in FIG. 2(A) is delivered from the capacitor C11, the voltage level at the first input terminal 6 of the comparator 3 changes as indicated by numeral 14 in FIG. 3(A). In particular, after a kick voltage 15 shown in FIG. 3(A) brings the signal at the output terminal 8 of the comparator 3 to high level, the voltage at the first input terminal 6 is made larger than the threshold value TH'. Then, another kick voltage 16 shown in FIG. 3(A) brings the signal at the output terminal 8 of the comparator 3 to low level, after which the voltage at the first input terminal 6 is kept below the threshold value TH'. As a result, the output at the output terminal 8 of the comparator 3 takes a rectangular waveform as shown in FIG. 2(B).

Figure 3B:

FIG. 3(B) shows the operation of the circuit of FIG. 1 when the rectangular signal applied to the capacitor C11 (FIG. 1) has a sufficiently high repetition frequency. The time axis in this figure is taken to a larger scale than in the case of FIG. 3(A).

When the aforementioned repetition frequency is sufficiently high, the rectangular signal goes low before the capacitor is fully charged. Consequently, as indicated by the solid line in FIG. 3(B), the capacitor C11 delivers an output that is a relatively good replica of the rectangular signal applied to the capacitor C11. A signal 17 indicated by the solid line in FIG. 3(B) is obtained by superimposing the level shift (FIG. 3(A)) due to the diode D1 or D2 onto the signal delivered from the capacitor C11. This resultant signal 17 is compared with the threshold value TH'. As a result, the output from the output terminal 8 of the comparator 3 also takes a rectangular waveshape as shown in FIG. 2(B).

As thus far described, the present invention dispenses with the use of an expensive DC amplifier, and permits the use of an AC amplifier in the ampification stage when amplification is needed. Also, the novel circuit is not readily affected by temperature variations. Further, the structure of the circuit is simple. In addition, the novel circuit has a wave-shaping function in the same manner as an ATC (automatic threshold level control) circuit.

What is claimed is:

1. A wave-shaping circuit comprising:
    a comparator having first and second input terminals and an output terminal for comparing the voltage level of an input signal applied to the first input terminal with a threshold level applied to the second input terminal and delivering an output signal at its output terminal corresponding to the result of the comparison;
    a pair of diodes connected in antiparallel relation between the first and second input terminals of the comparator;
    a capacitor connected between the first input terminal of the comparator and an input signal source for cutting off a DC component of the signal source;
    a pull-up resistor connected between the output terminal of the comparator and a power source terminal;
    a feedback resistor connected between the output terminal and the first input terminal of the comparator; and
    a zener diode connected between ground and a common connection point with the second input terminal of the comparator and with the power source terminal through a bias resistor for establishing the threshold level applied to the second input terminal,
    whereby the input signal to the comparator is shifted higher or lower by a predetermined value than the threshold level by the shifting of signal level through the pair of antiparallel diodes depending on the voltage appearing at the output terminal of the comparator fed back to the the diodes through the feedback resistor.

2. A wave-shaping circuit according to claim 1, wherein a rectangular waveform is supplied by said input signal source, and the cutoff capacitor is characterized by a charging time that is longer than the period of the rectangular waveform.

* * * * *